US007732867B2

United States Patent
Akiyama et al.

(10) Patent No.: US 7,732,867 B2
(45) Date of Patent: Jun. 8, 2010

(54) METHOD FOR MANUFACTURING SOQ SUBSTRATE

(75) Inventors: Shoji Akiyama, Gunma (JP); Yoshihiro Kubota, Gunma (JP); Atsuo Ito, Gunma (JP); Koichi Tanaka, Gunma (JP); Makoto Kawai, Gunma (JP); Yuuji Tobisaka, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 189 days.

(21) Appl. No.: 11/979,447

(22) Filed: Nov. 2, 2007

(65) Prior Publication Data

US 2008/0118757 A1     May 22, 2008

(30) Foreign Application Priority Data

Nov. 10, 2006   (JP)   ............................. 2006-305665

(51) Int. Cl.
*H01L 29/00*   (2006.01)
(52) U.S. Cl. ............... 257/352; 257/347; 257/E21.568; 438/800; 438/967
(58) Field of Classification Search ................. 257/347, 257/352, E21.568; 438/458, 967, 800
See application file for complete search history.

(56) References Cited

U.S. PATENT DOCUMENTS

| | | | |
|---|---|---|---|
| 5,395,788 | A | 3/1995 | Abe et al. |
| 7,217,639 | B2 * | 5/2007 | Maurice et al. ............. 438/458 |
| 7,449,395 | B2 * | 11/2008 | Allibert et al. ............. 438/459 |
| 2006/0059948 | A1 * | 3/2006 | Sato et al. ................... 65/32.1 |

FOREIGN PATENT DOCUMENTS

| | | |
|---|---|---|
| EP | 1 352 986 A2 | 10/2003 |
| EP | 1 580 170 A1 | 9/2005 |
| JP | A-5-211128 | 8/1993 |
| JP | B2-3048201 | 3/2000 |

OTHER PUBLICATIONS

Auberton-Hervéet al., "Smart Cut Technology: Industrial Status of SOI Wafer Production and New Material Developments," *Electrochemical Society Proceedings*, 1999, vol. 99, No. 3, p. 93-106.
X. Shi et al., "Characteristics of Transistors Fabricated on Silicon-on-Quartz Prepared Using A Mechanically Initiated Exfoliation Technique", IEEE Electron Device Letters, vol. 26, No. 9, pp. 607-609, Sep. 2005.

\* cited by examiner

*Primary Examiner*—Zandra Smith
*Assistant Examiner*—Christy L Novacek
(74) *Attorney, Agent, or Firm*—Oliff & Berridge, PLC

(57) ABSTRACT

Hydrogen ions are implanted to a surface (main surface) of the single crystal Si substrate 10 to form the hydrogen ion implanted layer (ion-implanted damage layer) 11. As a result of the hydrogen ion implantation, the hydrogen ion implanted boundary 12 is formed. The single crystal Si substrate 10 is bonded to the quartz substrate 20 having a carbon concentration of 100 ppm or higher, and an external shock is applied near the ion-implanted damage layer 11 to delaminate the Si crystal film along the hydrogen ion implanted boundary 12 of the single crystal Si substrate 10 out of the bonded substrate. Then, the surface of the resultant silicon thin film 13 is polished to remove a damaged portion, so that an SOQ substrate can be fabricated. There can be provided an SOQ substrate highly adaptable to a semiconductor device manufacturing process.

5 Claims, 1 Drawing Sheet

METHOD FOR MANUFACTURING SOQ SUBSTRATE

BACKGROUND OF THE INVENTION

1. Field of the Invention

The present invention relates to a technique of manufacturing a Silicon on Quartz (SOQ) substrate where a single crystal silicon thin film is formed on a quartz substrate.

2. Description of the Related Art

In recent years, a Silicon on Sapphire (SOS) substrate has received attentions as a radio-frequency (RF) device substrate because a sapphire lattice constant is close to that of single crystal silicon, so heteroepitaxial growth can proceed and in addition, the substrate is suitable for fabrication of an RF device.

As compared with a Metal Oxide Semiconductor (MOS) transistor fabricated on a silicon substrate, a MOS transistor having an SOS structure is advantageous in that a power of an RF signal that leaks to a ground side through a sapphire substrate (power loss/signal loss) is small because of a small source-ground/drain-ground stray capacitance of the transistor.

On the other hand, the sapphire substrate has a problem in that the substrate is very expensive and it is difficult to increase its diameter. As a conceivable alternative to the sapphire substrate, there is a quartz substrate that is inexpensive and can increase its diameter as compared with the sapphire substrate. However, if the quartz substrate is used as a Silicon on Insulator (SOI) substrate, since epitaxial growth cannot proceed in a single crystal silicon film on the quartz substrate, it is necessary to transfer the single crystal silicon film onto the quartz substrate by a so-called "bonding method" (see Japanese Patent No. 3048201 and A. J. Auberton-Herve et al., "SMART CUT TECHNOLOGY: INDUSTRIAL STATUS of SOI WAFER PRODUCTION and NEW MATERIAL DEVELOPMENTS" (Electrochemical Society Proceedings Volume 99-3 (1999) p. 93-106), for example).

SUMMARY OF THE INVENTION

However, the SOQ substrate prepared by the bonding method has the following problem about a device manufacturing process. Since quartz is transparent in a wide wavelength range including a visible light region and a near infrared region, a sensor used for transfer or alignment of an SOQ wafer during a process (mainly transmission type sensor for monitoring transmitted laser light to detect a wafer) cannot detect a quartz wafer. This problem is involved in an SOQ wafer including a silicon thin film formed on the surface as well.

Even if a back surface of the quartz substrate is subjected to sandblasting and made rough in order to solve the above problems, back-surface reflection hardly occurs due to relatively small reflectivity of quartz (n=about 1.45), and in addition, the back-surface roughness might impair flatness of the SOQ substrate.

The present invention has been accomplished in view of the above problems. It is accordingly an object of the present invention to provide an SOQ substrate that costs low and enables a large diameter compared with an SOS substrate, and is highly adaptable to a semiconductor device manufacturing process.

To solve the above problems, in an SOQ substrate according to the present invention, a quartz substrate having a carbon concentration of 100 ppm or higher is used as a quartz substrate supporting a single crystal silicon thin film.

Further, a method for manufacturing the SOQ substrate includes: an ion implantation step of implanting hydrogen ions to a main surface side of a single crystal silicon substrate; a surface treatment step of performing surface activation through plasma treatment or ozone treatment on at least one of a main surface of the single crystal silicon substrate and a main surface of a quartz substrate having a carbon concentration of 100 ppm or higher; a step of bonding the main surface of the single crystal silicon substrate and the main surface of the quartz substrate; and a delamination step of delaminating a single crystal silicon film along a hydrogen ion implanted boundary of the bonded substrate to form a single crystal silicon thin film on the quartz substrate.

Preferably, the method further includes a step of performing heat treatment on the single crystal silicon substrate and quartz substrate, which are bonded together, at a temperature of 350° C. or lower after the bonding step and before the delamination step.

Further, the delamination step is preferably carried out by applying a mechanical shock onto a hydrogen ion implanted region at an edge of the single crystal silicon substrate.

According to the present invention, a quartz substrate having a carbon concentration 100 ppm or higher is used as a quartz substrate supporting a single crystal silicon thin film. Hence, it is possible to provide an SOQ substrate that costs low and enables a large diameter compared with an SOS substrate, and is highly adaptable to a semiconductor device manufacturing process.

Further, if an RF device is manufactured with this SOQ substrate, a power loss or signal loss of the device can be reduced similarly to an RF device having an SOS structure.

DETAILED DESCRIPTION OF THE PREFERRED EMBODIMENTS

Figure 1:
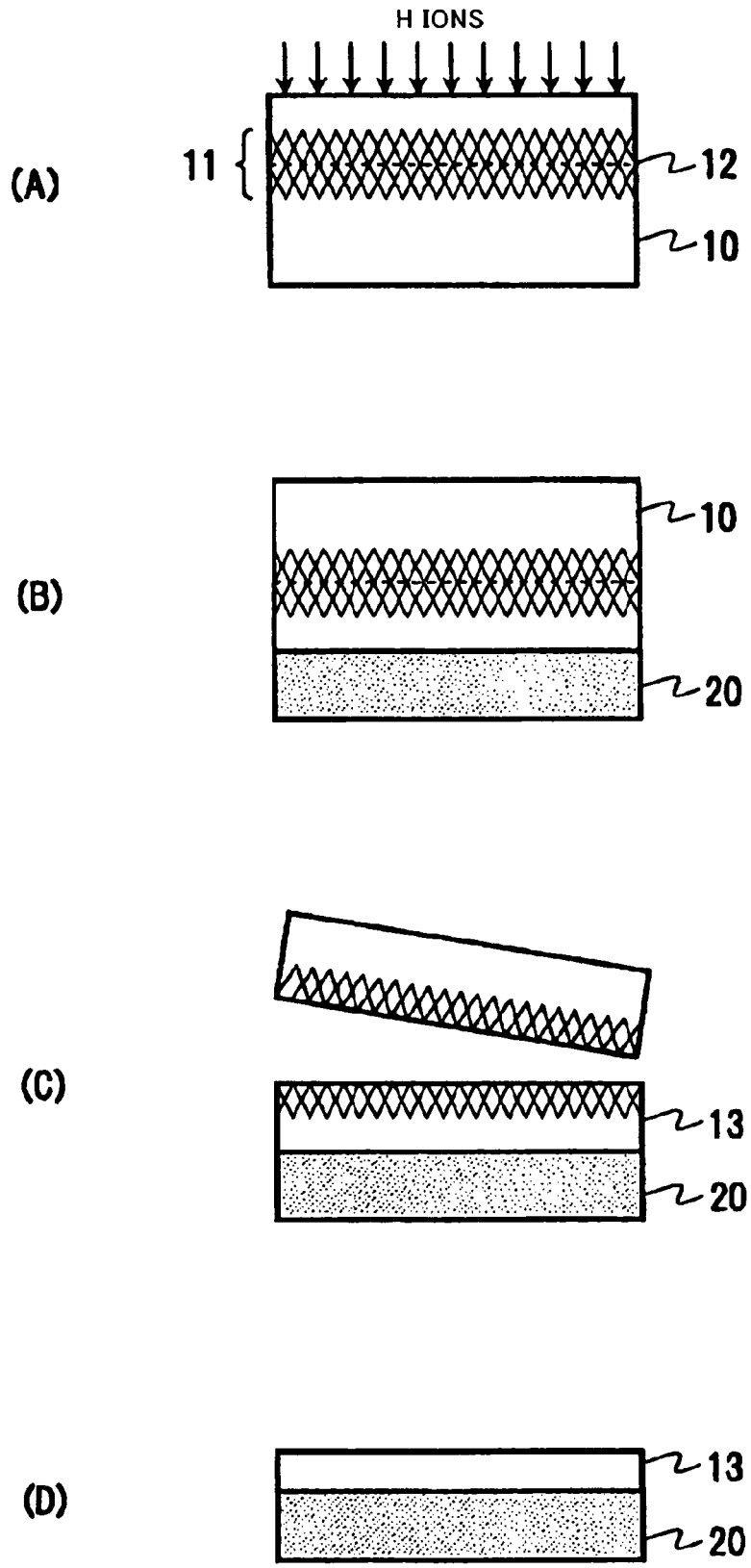
FIG. 1 is an explanatory view of an example of a manufacturing process of an SOQ substrate according to the present invention.

Hereinafter, an embodiment of the present invention will be described on the basis of examples.

Example 1

FIG. 1 illustrate a process example of a method for manufacturing an SOQ substrate of this embodiment. Reference numeral 10 of FIG. 1(A) denotes a single crystal Si substrate. In this example, the single crystal Si substrate 10 is a commercially available Si substrate grown by a Czochralski method (CZ method), for example. Its electric characteristic value such as a conductivity type or a specific resistance, or crystal orientation or crystal diameter is appropriately determined depending on a design value or process of a device using a semiconductor substrate manufactured by the method of the present invention or a display area of a manufactured device. Further, an oxide film may be formed in advance on a surface (bonding surface) of the single crystal Si substrate 10.

First, hydrogen ions are implanted to a surface (main surface) of the single crystal Si substrate 10 to form a hydrogen ion implanted layer (ion-implanted damage layer) 11. As a result of the hydrogen ion implantation, a "hydrogen ion implanted boundary" 12 is formed at a predetermined depth (average ion implantation depth L) near the surface of the single crystal Si substrate 10, and a localized "micro bubble layer" is formed in the region (FIG. 1(A)). The hydrogen ion implanted boundary 12 serves as a "junction surface" (bonding surface) later.

At the time of implanting hydrogen ions, its dosage is appropriately selected from a range of, $1 \times 10^{16}$ to $4 \times 10^{17}$ atoms/cm$^2$ in accordance with specifications of the SOQ substrate or the like. Incidentally, it has been known that, if an SOI substrate is fabricated with a "SmartCut method" that is a conventional method as disclosed in Japanese Patent No. 3048201 and A. J. Auberton-Herve et al., "SMART CUT TECHNOLOGY: INDUSTRIAL STATUS of SOI WAFER PRODUCTION and NEW MATERIAL DEVELOPMENTS" (Electrochemical Society Proceedings Volume 99-3 (1999) p. 93-106) under such conditions that a dosage of hydrogen ions exceeds $1 \times 10^{17}$ atoms/cm$^2$, an SOI layer formed in a subsequent step involves surface roughness. Thus, the dosage is generally set to about $7 \times 10^{16}$ atoms/cm$^2$.

However, the present inventors have made extensive studies and revealed that surface roughness of the SOI layer that would occur under the above ion implantation conditions of the conventional method is caused by a heat treatment process carried out at relative high temperature (for example, 500° C.) for delaminating a silicon thin film and forming an SOI layer, not by the hydrogen ion dosage itself.

In the case of fabricating an SOI substrate with the Smart-Cut method, hydrogen ions are implanted to a bonding surface side of a silicon substrate to generate "air bubbles" called "hydrogen blisters" at high density to thermally delaminate the silicon thin film based on "bubble growth" of the "hydrogen blisters", which proceeds through heat treatment at relatively high temperature. Here, the "bubble growth" is a diffusion phenomenon of hydrogen atoms. Therefore, in a process that "bubbles" "grow" at extremely high density under high dosage conditions, hydrogen atoms diffuse remarkably. The atomic diffusion phenomenon would cause surface roughness of the SOI layer.

Therefore, if the silicon thin film can be delaminated at low temperature, diffusion of hydrogen atoms in the delamination process is considerably suppressed. Therefore, even if hydrogen ions are implanted with a high dosage, surface roughness of the delaminated silicon film never occurs.

The present inventors have executed implantation of hydrogen ions with varying dosages and examined an influence of the implantation on surface roughness of the delaminated silicon film under the above assumption. The examination result shows that surface roughness does not occur with a dosage of $4 \times 10^{17}$ atoms/cm$^2$ or less as long as a low-temperature delamination process is performed as described below.

A depth of the ion implanted layer 11 from the single crystal Si substrate 10 (average ion implantation depth L) is controlled in accordance with an acceleration voltage of implanted ions and is determined depending on a thickness of a silicon film to be delaminated. For example, the average ion implantation depth L is set to 0.5 μm or less, and the acceleration voltage is set to 50 to 100 keV. Incidentally, as is generally carried out to suppress channeling of implanted ions in a process of implanting ions into Si crystal, an insulator film such as an oxide film may be formed beforehand on an ion implantation surface of the single crystal Si substrate 10 to implant ions through the insulator film.

The single crystal Si substrate 10 including an ion-implanted damage layer 11 that is formed by implanting hydrogen ions is bonded to a quartz substrate 20 (FIG. 1(B)). Incidentally, these substrates have substantially the same diameter. It is advantageous to form orientation flat (OF) also in the quartz substrate 20 similar to OF formed in the single crystal Si substrate 10 and bond the substrates together while aligning the OFs with an aim to facilitate a subsequent device manufacturing process.

The quartz substrate 20 is added with carbon in a concentration of 100 ppm or higher, and is opaque black as visually observed. Therefore, a problem that a sensor used for transfer or alignment of an SOQ wafer during a process cannot detect a quartz wafer can be solved. Incidentally, the RF device substrate may not transmit visible light, for example, insofar as parasitic radio frequency (RF) coupling is suppressed. In this regard, the above carbon-added "black quartz" has a property almost equivalent to transparent quartz in a frequency range around GHz used in the RF device. In addition, it is unnecessary to make the back surface rough to control transmittance (back-surface reflectivity), and a double-side polished wafer can be used and a highly flat SOQ substrate can be easily prepared.

Here, the reason the carbon concentration is set to 100 ppm or higher is that a transmittance is insufficient in a concentration lower than the above value with a general wafer thickness. In general, the carbon concentration is preferably 200 ppm to 400 ppm. Incidentally, in this example, a quartz substrate having a carbon concentration of 300 ppm is employed.

The bonding is performed by subjecting bonding surfaces of both of the single crystal Si substrate 10 and the quartz substrate 20 to plasma treatment or ozone treatment for cleaning or activating the surface. This surface treatment is carried out for the purpose of removing an organic material from the surface as the bonding surface or increasing OH groups on the surface to activate the surface, and the treatment is not necessarily performed on both of the bonding surfaces of the single crystal Si substrate 10 and the quartz substrate 20 but may be performed on one of the bonding surfaces.

In the case of performing the surface treatment through plasma treatment, a single crystal Si substrate and/or a quartz substrate with the surface being cleaned by RCA cleaning is placed on a sample stage in a vacuum chamber, and a plasma gas is introduced to the vacuum chamber up to a predetermined vacuum degree. Incidentally, examples of the usable plasma gas include an oxygen gas, a hydrogen gas, an argon gas, or a mixed gas thereof, which is used for surface treatment of a single crystal Si substrate, or a mixed gas of a hydrogen gas and a helium gas. An appropriate gas may be selected in accordance with a surface condition of the single crystal Si substrate or its application.

Further, if the surface treatment aims at oxidizing the single crystal Si surface, a gas containing at least an oxygen gas is used as the plasma gas. Incidentally, since the quartz substrate is oxidized, there is not particular limitation on selection of a plasma gas as in the above case. After the introduction of the plasma gas, an RF plasma having a power of about 100 W is generated and then applied to the surface of the single crystal Si substrate and/or the quartz substrate as a plasma treatment target for about 5 to 10 seconds, and the treatment is completed.

In the case of performing the surface treatment through ozone treatment, a single crystal Si substrate and/or a quartz substrate with the surface being cleaned by RCA cleaning is placed on a sample stage in a chamber kept in an atmosphere containing an oxygen, and plasma gas such as a nitrogen gas or an argon gas is introduced into the chamber, after which an RF plasma having a predetermined power is generated, and the oxygen in the atmosphere is turned into an ozone by the plasma to apply the treatment to the surface of the target single crystal Si substrate and/or quartz substrate for a predetermined period.

If the surfaces of the surface-treated single crystal Si substrate 10 and the quartz substrate 20 as bonding surfaces are closely bonded, the surface (bonding surface) of at least one of the two substrates is applied with surface treatment through the plasma treatment or ozone treatment and thus activated, so a bonding strength, which is high enough to withstand mechanical delamination or polishing in a subsequent step even in a closely-attached (bonded) state at room temperatures, can be obtained. Incidentally, it is preferred to execute a step of heating the bonded substrate at relatively low temperature, 350° C. or lower, after the bonding step from the viewpoint of weakening chemical bonds of Si atoms in the ion-implanted damage layer 11.

Subsequently, an external shock is applied to delaminate a Si crystal film along a hydrogen ion implanted boundary 12 of the single crystal Si substrate 10 out of the heat-treated bonded substrate (FIG. 1(C)). The heat treatment aims at weakening chemical bonds of Si atoms in the ion-implanted damage layer 11 to lower the mechanical strength. Then, the surface of the resultant silicon thin film 13 is polished to remove a damaged portion, so that a semiconductor substrate can be fabricated (FIG. 1(D)).

Here, there are various techniques for externally applying a shock to delaminate the silicon thin film. For example, a mechanical shock is applied to a hydrogen ion implanted region (near the hydrogen ion implanted boundary) at an edge of the single crystal Si substrate. The chemical bonds of Si atoms in the ion-implanted damage layer 11 are already weakened through the heat treatment at 350° C. Hence, if any technique is employed, a shock level is much lower than that in a conventional method. Therefore, a damage involved in mechanical delamination of the silicon thin film is avoided.

According to the present invention, it is possible to provide an SOQ substrate that costs low and enables a large diameter compared with an SOS substrate, and is highly adaptable to a semiconductor device manufacturing process. Further, if an RF device is manufactured with this SOQ substrate, a power loss or signal loss of the device can be reduced similarly to an RF device having an SOS structure.

What is claimed is:

1. A silicon on quartz (SOQ) substrate, comprising a single crystal silicon thin film formed on a quartz substrate having a carbon concentration of 100 ppm or higher.

2. A method for manufacturing an SOQ substrate, comprising:
    an ion implantation step of implanting hydrogen ions to a main surface side of a single crystal silicon substrate;
    a surface treatment step of performing surface activation through plasma treatment or ozone treatment on at least one of a main surface of the single crystal silicon substrate and a main surface of a quartz substrate having a carbon concentration of 100 ppm or higher;
    a step of bonding the main surface of the single crystal silicon substrate and the main surface of the quartz substrate; and
    a delamination step of delaminating a single crystal silicon film along a hydrogen ion implanted boundary of the bonded substrate to form a single crystal silicon thin film on the quartz substrate.

3. The method for manufacturing an SOQ substrate according to claim 2, wherein the delamination step is carried out by applying a mechanical shock onto a hydrogen ion implanted region at an edge of the single crystal silicon substrate.

4. The method for manufacturing an SOQ substrate according to claim 2, further comprising a step of performing heat treatment on the single crystal silicon substrate and quartz substrate, which are bonded together, at a temperature of 350° C. or lower after the bonding step and before the delamination step.

5. The method for manufacturing an SOQ substrate according to claim 4, wherein the delamination step is carried out by applying a mechanical shock onto a hydrogen ion implanted region at an edge of the single crystal silicon substrate.

* * * * *